(12) United States Patent
Xiao et al.

(10) Patent No.: US 8,178,409 B2
(45) Date of Patent: May 15, 2012

(54) SEMICONDUCTOR DEVICE WITH ALTERNATELY ARRANGED P-TYPE AND N-TYPE THIN SEMICONDUCTOR LAYERS AND METHOD FOR MANUFACTURING THE SAME

(75) Inventors: Shengan Xiao, Shanghai (CN); Feng Han, Shanghai (CN)

(73) Assignee: Shanghai Hua Hong Nec Electronics Company, Limited, Shanghai (CN)

( * ) Notice: Subject to any disclaimer, the term of this patent is extended or adjusted under 35 U.S.C. 154(b) by 125 days.

(21) Appl. No.: 12/832,963

(22) Filed: Jul. 8, 2010

(65) Prior Publication Data
US 2011/0006304 A1   Jan. 13, 2011

(30) Foreign Application Priority Data
Jul. 9, 2009   (CN) .......................... 2009 1 0057581

(51) Int. Cl.
*H01L 29/15* (2006.01)
*H01L 21/336* (2006.01)

(52) U.S. Cl. ........ 438/270; 438/138; 438/156; 438/192; 438/212; 438/296; 438/422; 438/427; 257/49; 257/137; 257/138; 257/329; 257/341; 257/368; 257/397; 257/E21.345; 257/E21.346; 257/E21.418; 257/E29.021; 257/E29.027; 257/E29.257

(58) Field of Classification Search .................. 438/138, 438/156, 192, 212, 270, 296, 422, 427; 257/49, 257/137, 138, 329, 341, 368, 397, E21.345, 257/E21.346, E21.418, E29.021, E29.027, 257/E29.257
See application file for complete search history.

(56) References Cited

U.S. PATENT DOCUMENTS

| | | | |
|---|---|---|---|
| 7,759,204 B2* | 7/2010 | Hshieh et al. ................. | 438/296 |
| 8,084,811 B2* | 12/2011 | Disney et al. ................. | 257/329 |
| 2005/0170587 A1* | 8/2005 | Izumisawa et al. ........... | 438/270 |
| 2005/0181564 A1* | 8/2005 | Hshieh et al. ................ | 438/270 |

* cited by examiner

*Primary Examiner* — Dao H Nguyen
(74) *Attorney, Agent, or Firm* — Rabin & Berdo, P.C.

(57) ABSTRACT

The invention is related to a semiconductor device with alternately arranged P-type and N-type thin semiconductor layers and method for manufacturing the same. For P-type device, the method includes trench formation, thermal oxide formation on trench sidewalls, N-type silicon formation in trenches, N-type impurity diffusion through thermal oxide into P-type epitaxial layer, oxidation of N-type silicon in trenches and oxide removal. In the semiconductor device, N-type thin semiconductor layers are formed by N-type impurity diffusion through oxide to P-type epitaxial layers, and trenches are filled with oxide. With this method, relatively low concentration impurity in high voltage device can be realized by current mass production process, and the device development cost and manufacturing cost are decreased.

14 Claims, 5 Drawing Sheets

# SEMICONDUCTOR DEVICE WITH ALTERNATELY ARRANGED P-TYPE AND N-TYPE THIN SEMICONDUCTOR LAYERS AND METHOD FOR MANUFACTURING THE SAME

BACKGROUND OF THE INVENTION

1. Field of the invention

The invention relates to manufacturing methods of semiconductor devices and, more particularly, to a semiconductor device with alternately arranged P-type and N-type thin semiconductor layers and a method for manufacturing the same.

2. Description of Related Art

As shown in FIG. 1, the superjunction MOSFET (metal oxide semiconductor field effect transistor) adopts a new voltage-withstanding structure consisting of a series of alternately arranged P-type and N-type semiconductor thin layers. At off state, both P-type and N-type charges can be fully depleted at relative low voltage by charge compensation. Thereby high breakdown voltage can be realized even the impurity concentration in P-type and N-type doping region is high. And low on-resistance of the device can be realized because the impurity concentration of doping region is several times as that in conventional MOSFET. Therefore the device performance of the superjunction MOSFET can break the silicon limit of the conventional MOSFET (cf, Hu. C., Rec. Power Electronics Specialists Conf., San Diego, (1979), P 385).

Currently, there are two ways to manufacture the new voltage-withstanding structure consisting of a series of alternately arranged P-type and N-type semiconductor thin layers. One way is multiple epitaxial process: it uses multiple epitaxial film deposition, lithography and implantation to get alternately arranged P-type and N-type doping region. The other way is trench process: it etches a trench first, and then either fills the trench with conducting silicon or does tilted implanting to the trench sidewall. The multiple epitaxial process is a complicated process with high cost, and it is difficult to control. For the trench process, the tilted implanting process has poor stability and repeatability for mass production. Therefore, the silicon filling option is attracting more and more attention. For the silicon filling option, the key process is doing silicon film deposition to fill the trench and then get the silicon outside of the trench removed by CMP (chemical physical polishing). It was reported that epitaxial single crystal silicon can be used as the filling material. However, for a trench with the depth of 40-50 μm or deeper, this epitaxial filling process has many drawbacks, such as high time cost, technical difficulties, because the void free epitaxial film is hard to realize for high aspect ratio trench (aspect ratio is higher than 5). Moreover, during production, the inline process control on both impurity concentration and the defects is hard, because when the epitaxial film fills the trench, the monitor method for blank epitaxial defects and impurity concentration will not apply. It is reported that doped polysilicon can be used to fill the trench, but normally only high concentration impurity at the range of E18-E20 atoms/$cm^3$ can be realized by current tool such as a furnace. This concentration level is too high for high voltage devices whose doping concentration of voltage withstand layer is about E15-E17 atoms/$cm^3$. If the current furnace is used to get polysilicon at relatively low concentration impurity at the range of E15-E17 atoms/$cm^3$, only a portion of the furnace can be effectively used because of the non-uniformity within the furnace. Therefore the productivity of the furnace is low.

SUMMARY OF THE INVENTION

An objective of the invention is to provide a manufacturing method of a semiconductor device with alternately arranged P-type and N-type thin semiconductor layers. With this method, relatively low concentration thin semiconductor layers can be realized by the current mature process with high concentration doping. Another objective of the invention is to provide a semiconductor device with alternately arranged P-type and N-type thin semiconductor layers.

To achieve the above objective, the invention provides a manufacturing method of a semiconductor device structure with alternately arranged P-type and N-type thin semiconductor layers, comprising the following steps:

step1: depositing dielectric on a P-type epitaxial layer, wherein the dielectric is oxide;

step2: forming trenches in the dielectric by lithography and etching;

step3: forming thermal oxide film on the surfaces of the trenches and the dielectric;

step4: depositing N-type silicon on the thermal oxide film, wherein the N-type silicon is polysilicon or amorphous silicon;

step5: diffusing the N-type impurity of the N-type silicon in the trenches through the thermal oxide film into the P-type epitaxial layer by thermal diffusion technique;

step6: completely oxidizing the N-type silicon to fully fill the trenches with oxide;

step7: removing the oxide and the dielectric on the P-type epitaxial layer.

In a better embodiment, photo resist or the dielectric is used as a block mask in the etching process to form the trenches.

In a better embodiment, the thermal oxide film and the dielectric on the P-type epitaxial layer after step 3 are thick enough to block the diffusion of the N-type impurity of the N-type silicon into the P-type epitaxial layer in step 5.

In a better embodiment, the thickness of the N-type silicon in the trench is less than 0.25 times of the width of the trench.

To achieve the above objective, the invention provides a manufacturing method of a semiconductor device with alternately arranged P-type and N-type thin semiconductor layers, comprising the following steps:

step1: depositing dielectric on a P-type epitaxial layer, wherein the dielectric is an oxide layer with a nitride layer formed thereon;

step2: forming trenches in the dielectric by lithography and etching;

step3: forming thermal oxide film on the surfaces of the trenches and the dielectric;

step4: depositing N-type silicon on the thermal oxide film, wherein the N-type silicon is polysilicon or amorphous silicon;

step5: diffusing the N-type impurity of the N-type silicon in the trenches through the thermal oxide film to the P-type epitaxial layer by thermal diffusion technique;

step6: completely oxidizing the N-type silicon to fully fill the trenches with oxide;

step7: removing the oxide and the dielectric on the P-type epitaxial layer.

In a better embodiment, photo resist or the dielectric is used as a block mask in the etching process to form the trenches.

In a better embodiment, the thermal oxide film and the dielectric on the P-type epitaxial layer after step 3 are thick enough to block the diffusion of the N-type impurity of the N-type silicon into the P-type epitaxial layer in step 5.

In a better embodiment, the thickness of the N-type silicon in the trench is less than 0.25 times of the width of the trench.

To achieve the above objective, the invention provides a semiconductor device structure with alternately arranged P-type and N-type thin semiconductor layers, comprising: a P-type epitaxial layer with trenches formed therein, wherein, each trench has a thermal oxide film formed on its surface, and the trenches are fully filled with oxide; N-type thin semiconductor layers, formed in the P-type epitaxial layer and beside the sidewalls of the trenches, the N-type thin semiconductor layers being formed by thermal diffusion of N-type impurity through the thermal oxide film into the P-type epitaxial layer, wherein the N-type impurity comes from an N-type silicon formed by polysilicon or amorphous silicon, the N-type silicon being deposited on the thermal oxide film in the trenches and being completely oxidized to form oxide to fill the trenches after the thermal diffusion.

To achieve the above objective, a manufacturing method of a semiconductor device structure with alternately arranged P-type and N-type thin semiconductor layers, comprising the following steps:

step1: depositing dielectric on an N-type epitaxial layer, wherein the dielectric is oxide;

step2: forming trenches in the dielectric by lithography and etching;

step3: forming thermal oxide film on the surfaces of the trenches and the dielectric;

step4: depositing P-type silicon on the thermal oxide film, wherein the P-type silicon is polysilicon or amorphous silicon;

step5: diffusing the P-type impurity of the P-type silicon in the trenches through the thermal oxide film into the N-type epitaxial layer by thermal diffusion technique;

step6: completely oxidizing the P-type silicon to fully fill the trenches with oxide;

step7: removing the oxide and the dielectric on the N-type epitaxial layer.

In a better embodiment, photo resist or the dielectric is used as a block mask in the etching process to form the trenches.

In a better embodiment, the thermal oxide film and the dielectric on the N-type epitaxial layer after step 3 are thick enough to block the diffusion of the P-type impurity of the P-type silicon into the N-type epitaxial layer in step 5.

In a better embodiment, the thickness of the P-type silicon in the trench is less than 0.25 times of the width of the trench.

To achieve the above objective, the invention provides a manufacturing method of a semiconductor device structure with alternately arranged P-type and N-type thin semiconductor layers, comprising the following steps:

step1: depositing dielectric on an N-type epitaxial layer, wherein the dielectric is an oxide layer with a nitride layer formed thereon;

step2: forming trenches in the dielectric by lithography and etching;

step3: forming thermal oxide film on the surfaces of the trenches and the dielectric;

step4: depositing P-type silicon on the thermal oxide film, wherein the P-type silicon is polysilicon or amorphous silicon;

step5: diffusing the P-type impurity of the P-type silicon in the trenches through the thermal oxide film into the N-type epitaxial layer by thermal diffusion technique;

step6: completely oxidizing the P-type silicon to fully fill the trenches with oxide;

step7: removing the oxide and the dielectric on the N-type epitaxial layer.

In a better embodiment, photo resist or the dielectric is used as a block mask in the etching process to form the trenches.

In a better embodiment, the thermal oxide film and the dielectric on the N-type epitaxial layer after step 3 are thick enough to block the diffusion of the P-type impurity of the P-type silicon into the N-type epitaxial layer in step 5.

In a better embodiment, the thickness of the P-type silicon in the trench is less than 0.25 times of the width of the trench.

To achieve the above objective, the invention provides a semiconductor device structure with alternately arranged P-type and N-type thin semiconductor layers, comprising: an N-type epitaxial layer with trenches formed therein, wherein each trench has a thermal oxide film formed on its surface, and the trenches are fully filled with oxide; P-type thin semiconductor layers, formed in the N-type epitaxial layer and beside the sidewalls of the trenches, the P-type thin semiconductor layers being formed by thermal diffusion of P-type impurity through the thermal oxide film to the N-type epitaxial layer, wherein the P-type impurity comes from a P-type silicon formed by polysilicon or amorphous silicon, is the P-type silicon being deposited on the thermal oxide film in the trenches and fully oxidized to form oxide to fill the trenches after the thermal diffusion.

For superjunction MOSFET, using furnaces to deposit doped polysilicon to form alternately arranged P-type and N-type semiconductor thin layers has the advantage of low cost. However, furnaces always have large size, when they are used for the deposition of doped polysilicon with medium impurity concentration (E15-E17 atoms/cm$^3$), it is hardly to meet both requirements of mass production and capacity. For example, only high concentration impurity at the range of E18-E20 atoms/cm$^3$ can be realized by furnaces. This concentration level is too high for high voltage device, whose doping concentration of voltage withstand layer is about E15-E17 atoms/cm3.

The present invention provides a method to realize relatively low concentration impurity silicon by production-able process with existed furnace. The present invention utilizes the property of diffusion that impurity concentration can be lowered by several orders of magnitude if the impurity is diffused through oxide. Therefore, low impurity concentration as required can be achieved by controling the oxide thickness and the impurity concentration of trench-filled silicon (either polysilicon or amorphous silicon). Furthermore, the device development cost and manufacturing cost will be decreased.

BRIEF DESCRIPTION OF THE DRAWINGS

These and other features, aspects, and advantages of the present invention will become better understood with regard to the following description, appended claims, and accompanying drawings.

DETAILED DESCRIPTION OF THE INVENTION

Figure 3:
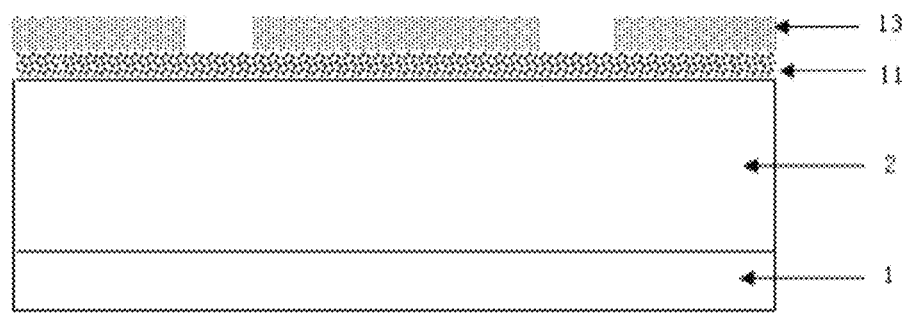
FIG. 3 is a cross-sectional view showing the semiconductor device structure after trench lithography process according to the embodiment of the invention.

In an embodiment of the invention, a 600V superjunction PMOSFET will be taken as an example to give the detail explanation. As shown in FIG. 3, in the embodiment, a P+ substrate 1 is used. The resistivity of the P+ substrate 1 is 0.001-0.003 ohm·cm. A P-type epitaxial layer 2 is formed on top of the P+ substrate 1. The resistivity and thickness of the P-type epitaxial layer 2 is 2-8 ohm·cm and 40-55 μm, respectively.

The manufacture process of this device is as follows:

Step 1: deposit a dielectric film 11 on the top of the P-type epitaxial layer 2 as shown in FIG. 3. The thickness of the dielectric film 11 is about 10000 angstrom. The dielectric film 11 can be either one single oxide layer or a two-layer structure, that is an oxide layer with a nitride layer formed thereon.

Step 2: coat photo resist 13 on the dielectric film 11, and form a trench pattern via resist exposure and development. The width of the trench is from 2 μm to 5 μm. And the pitch of the trenched pattern is from 7 μm to 15 μm.

Figure 4:
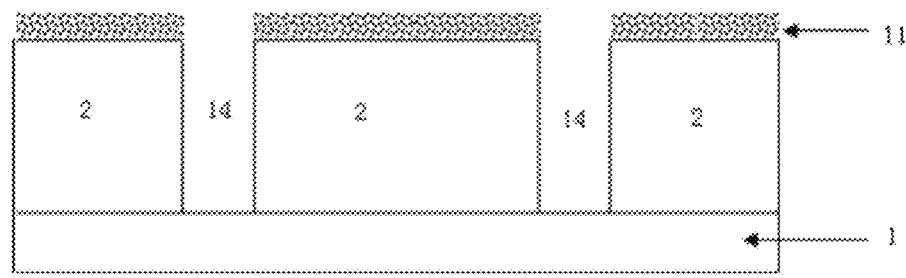
FIG. 4 is a cross-sectional view showing the semiconductor device structure after trench etch and resist removal process according to the embodiment of the invention.

Step 3: remove the exposed dielectric film 11 by either wet etch or dry etch, and remove the photo resist 13 by plasma ashing combined with wet clean. Use the remaining dielectric film 11 as a block mask, and etch the P-type epitaxial layer 2 uncovered by the remaining dielectric film 11 to form trenches 14 (refer to FIG. 4). In a better embodiment, the thickness of the remaining dielectric film 11 after the trenches are formed is suggested to be thicker than 3000 angstrom.

Step 4: perform thermal oxidation to form a thermal oxide film 15 on the surfaces of the dielectric film 11 and the trenches 14 (both on sidewalls and bottom of the trenches 14). In a better embodiment, the thickness of the thermal oxide film 15 on the sidewalls of the trenches is around 100-1000 angstrom (refer to FIG. 5). When the dielectric film 11 is composed of oxide and nitride, the nitride layer can be either removed or retained before the thermal oxidation process.

Figure 5:
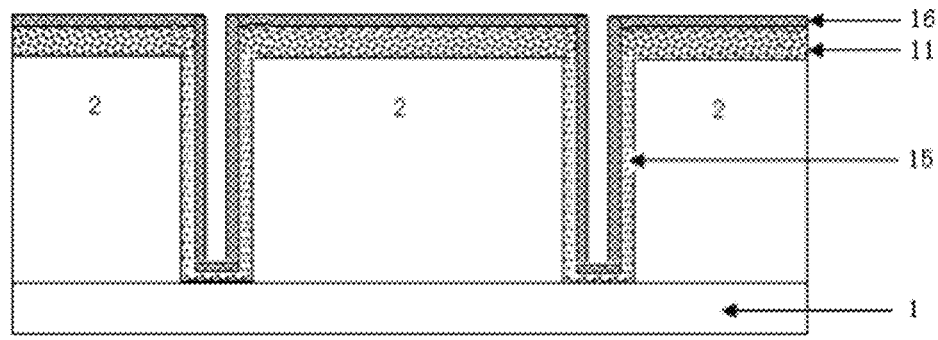
FIG. 5 is a cross-sectional view showing the semiconductor device structure after N-type polysilicon or amorphous silicon deposited on thermal oxide according to the embodiment of the invention.

Step 5: deposit N-type silicon 16 (for example, phos as the impurity) on the thermal oxide film 15 (as shown in FIG. 5). The N-type silicon 16 can be polysilicon or amorphous silicon. The impurity concentration of the N-type silicon 16 is about 1E18-8E20 atoms/cm$^3$. The thickness of the N-type silicon 16 is about 1000-7000 angstrom, which is less than 0.25 times of the width of the trench. The impurity concentration here is designed based on the TCAD (Technology computer aided design) simulation results considering the thermal diffusion process like temperature, time etc. By production-able process with existed furnace, the N-type impurity concentration can be 1E18-8E20 atoms/cm3. The N-type silicon can be polysilicon when the temperature of the silicon filling process is higher than 550° C. The N-type silicon can be amorphous silicon when the temperature of the silicon filling process is at the range of 500-550° C.

Figure 6:
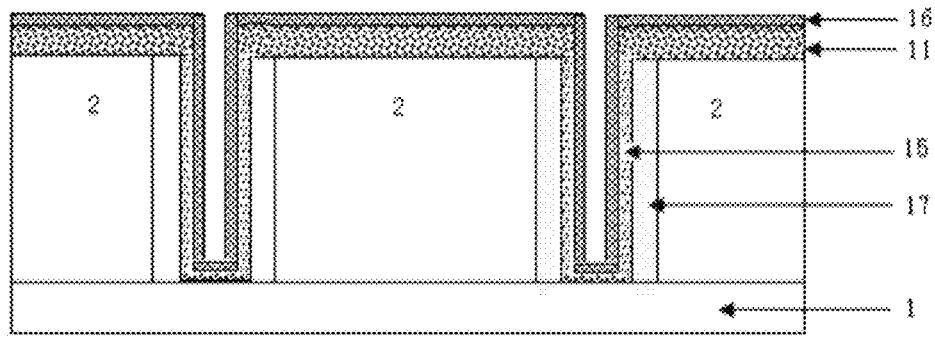
FIG. 6 is a cross-sectional view showing the semiconductor device structure after impurity in polysicon or amorphous silicon diffused through oxide according to the embodiment of the invention.

Step 6: diffuse the N-type impurity in the N-type silicon 16 through the thermal oxide film 15 to the P-type epitaxial layer 2 by thermal diffusion technique. The temperature of the thermal diffusion process is at the range of 1000-1200° C. and the time is 10-300 minutes. After the thermal diffusion process, N-type layers 17 are formed beside the sidewalls of the trenches, as shown in FIG. 6. It should be mentioned that, the thermal oxide film 15 and the dielectric film 11 on the top of the P-type epitaxial layer 2 after step 4 are thick enough to block the diffusion of the N-type impurity into the P-type epitaxial layer 2 in this step. The N-type silicon 16, either polysilicon or amorphous silicon, will become polysilicon after the high temperature thermal diffusion process. The temperature and time setting for the thermal diffusion process should meet the requirement of charge balance of P-type and N-type impurities.

Figure 1:
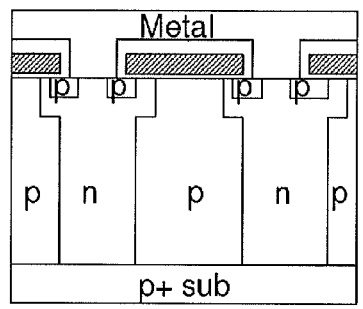
FIG. 1 is a cross-sectional view showing an existed vertical superjunction PMOSFET.
Figure 2:
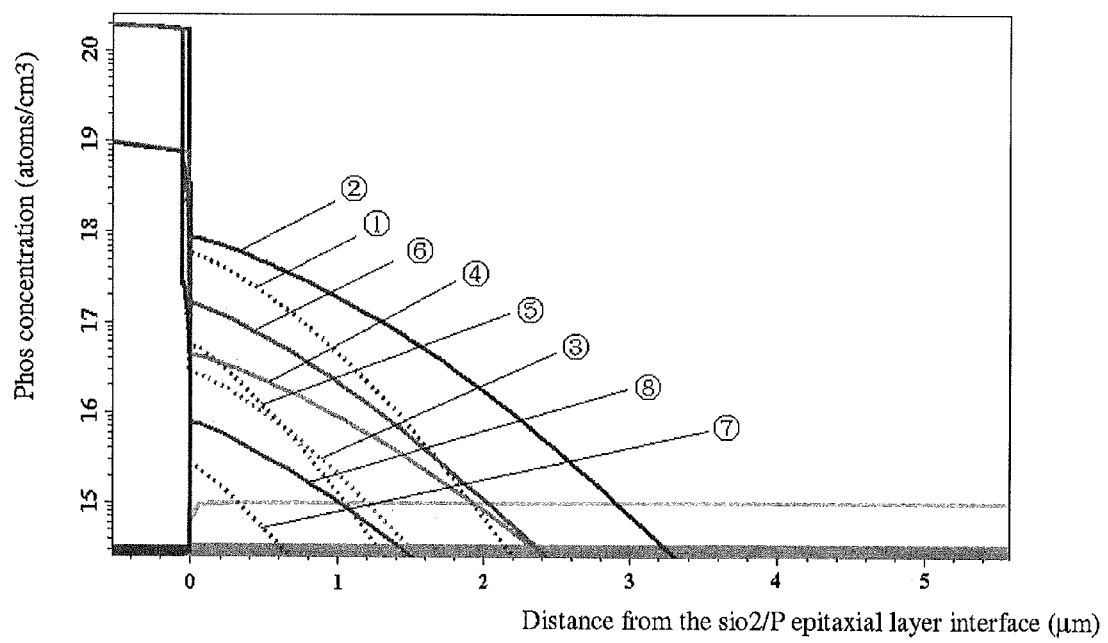
FIG. 2 is a TCAD simulation result showing the relationship between impurity concentration and different oxide thicknesses after thermal diffusion of doped polysilicon.

By optimal combination of impurity of the N-type silicon 16, the thickness of the thermal oxide film 15 on the sidewalls of the trenches 14, and the high temperature thermal diffusion process, the N-type layers 17 with desired thickness and impurity concentration can be realized. FIG. 2 is a simulation result to show the relationship of impurity concentration and the thickness of the oxide under different conditions of temperature and time in step 6. In FIG. 2, several curves are shown. Wherein, Curve ① represents the case that the thickness of the thermal oxide film 15 is 150 angstrom, the N-type impurity concentration within the N-type silicon 16 is 2E20 atoms/cm$^3$; the temperature and time of the thermal diffusion process are 1150° C. and 30 minutes respectively. Curve ② represents the case that the thickness of the thermal oxide film 15 is 150 angstrom, the N-type impurity concentration within the N-type silicon 16 is 2E20 atoms/cm$^3$; the temperature and time of the thermal diffusion process are 1150° C. and 120 minutes respectively. Curve ③ represents the case that the thickness of the thermal oxide film 15 is 150 angstrom, the N-type impurity concentration within the N-type silicon 16 is 1E19 atoms/cm$^3$; the temperature and time of the thermal diffusion process are 1150° C. and 30 minutes respectively. Curve ④ represents the case that the thickness of the thermal oxide film 15 is 150 angstrom, the N-type impurity concentration within the N-type silicon 16 is 1E19 atoms/cm$^3$; the temperature and time of the thermal diffusion process are 1150° C. and 120 minutes respectively. Curve ⑤ represents the case that the thickness of the thermal oxide film 15 is 600 angstrom, the N-type impurity concentration within the N-type silicon 16 is 2E20 atoms/cm$^3$; the temperature and time of the thermal diffusion process are 1150° C. and 30 minutes respectively. Curve ⑥ represents the case that the thickness of the thermal oxide film 15 is 600 angstrom, the N-type impurity concentration within the N-type silicon is 2E20 atoms/cm$^3$; the temperature and time of the thermal diffusion process are 1150° C. and 120 minutes respectively. Curve ⑦ represents the case that the thickness of the thermal oxide film 15 is 600 angstrom, the N-type impurity concentration within the N-type silicon 16 is 1E19 atoms/cm$^3$; the temperature and time of the thermal diffusion process are 1150° C. and 30 minutes respectively. Curve ⑧ represents the case that the thickness of the thermal oxide film 15 is 600 angstrom, the N-type impurity concentration within the trench filled silicon is 1E19 atoms/cm$^3$; the temperature and time of thermal diffusion process are 1150° C. and 120 minutes respectively.

The thickness and resistivity of the N-type layers 17 formed in step 6 can be optimized based on the charge balance requirement if the resistivity of the P-type epitaxial layer 2, dimension of the device, etc. are defined. The thickness of the thermal oxide film 15, impurity concentration in the filled silicon 16, and the condition of the thermal diffusion process (such as temperature, time, etc.) can be designed. The possible impact of the high temperature process after step 6 to the impurity distribution should also be considered. The best condition should consider the process tolerance for the charge balance also.

Figure 7:
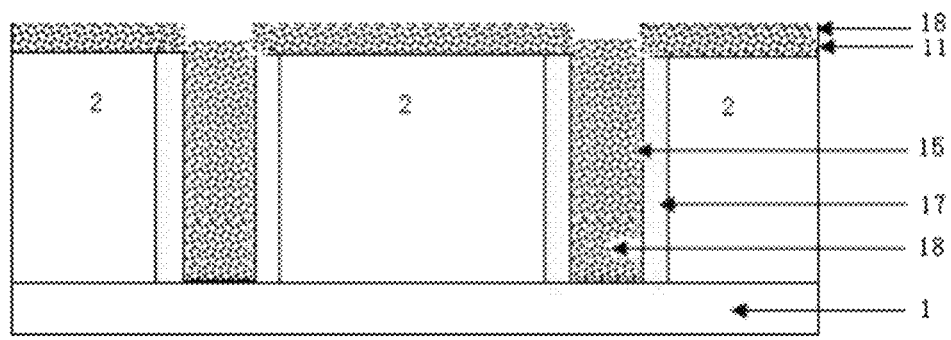
FIG. 7 is a cross-sectional view showing the semiconductor device structure after N-type polysilicon or amorphous silicon is all oxidized according to the embodiment of the invention.

Step 7: completely oxidize the N-type polysilicon to fully fill the trenches 14 with oxide. Continue the oxidization process until a certain thickness of oxide is formed on the dielectric film 11. Thereby, an oxide film 18 is formed (refer to FIG. 7).

Figure 8:
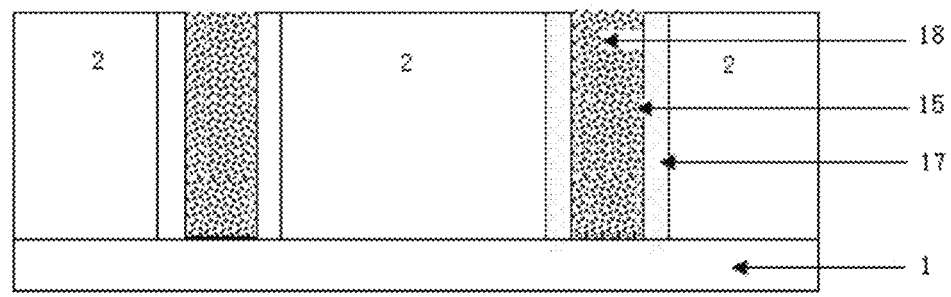
FIG. 8 is a cross-sectional view showing the semiconductor device structure after oxide etching back according to the embodiment of the invention.

Step 8: remove the oxide film 18 and the dielectric film 11 on the top of the P-type epitaxial layer 2 by etch back or CMP. The dishing of silicon after this process is suggested to be less than 5000 angstrom. So the structure with alternately arranged P-type and N-type thin semiconductor layers is formed, as shown in FIG. 8.

By the well-known processes in conventional vertical MOSFET, continue to execute the following process steps:

Step 9: form gate electrodes 4 by process of gate oxidation, polysilicon deposition and polysilicon patterning. Normally, the gate oxide is of 800-1000 angstrom, and the polysilicon is of 2000-4000 angstrom.

Step 10: form N wells 5 by N-type implantation and drive in process. And perform P+ lithography and implantation to form P+ sources 6.

Step 11. form P+ layers 7 by P+ lithography and P+ implantation.

Step 12. form dielectric layer 9 between poly and metal. And then, form contact holes by contact lithography and contact etching process. Normally, the thickness of the dielectric layer 9 is 8000-10000 angstrom.

Step 13: form surface metal patterning by metal deposition, metal lithography and metal etching processes. The source electrodes 10 and gate electrodes 4 are formed at the end of this step. The thickness of the metal is 20000-40000 angstrom, normally.

Step 14: form drain electrode 19 by the process of backside grinding and backside metallization.

Figure 9:
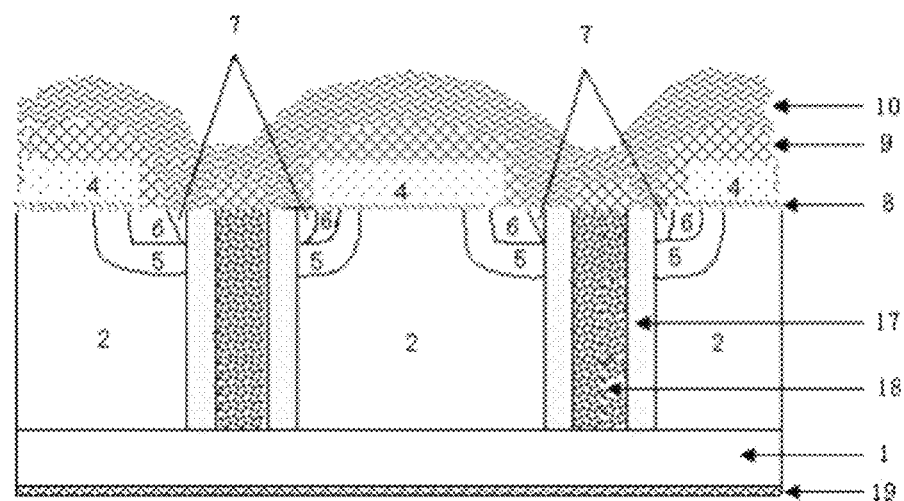
FIG. 9 is a cross-sectional view showing a super junction P MOSFET according to the embodiment of the invention.

After the above steps, the semiconductor device with alternately arranged P-type and N-type thin semiconductor layers is shown in FIG. 9.

If it is required to decrease the thickness of N-type thin semiconductor layers in device design, the P-type impurity distribution after step 9 should be minimized. To achieve this, the processes of N-well implantation and drive in can be implemented before the formation of the trenches 14. Besides, only the process of N well implantation can be implemented before the formation of the trenches 14, and the other process like N-well drive in can be realized in step 6 and 7.

In principle, the thermal oxide film 15 in step 4 can be replaced by other film like CVD (chemical vapor deposition) oxide film, as long as the film allows the impurity in the N-type silicon 16 to diffuse through itself into the P-type epitaxial layer 2 to achieve the concentration required, and the film does not bring adverse effects to device characteristics. However, thermal oxide film is recommended for its good stability.

In step 7, if the oxide can not fully fill the trenches after the N-type polysilicon is fully oxidized, additional oxide deposition step can be used to get the trenches fully filled. In any case, the trenches should be fully filled before entering step 8.

Corresponding to the aforementioned manufacturing method, the present invention also provides a semiconductor device structure with alternately arranged P-type and N-type thin semiconductor layers, comprising: a P-type epitaxial layer 2; trenches 14 formed in the P-type epitaxial layer 2, wherein, each trench 14 has a thermal oxide film 15 formed on its surface, and the trenches 14 are fully filled with oxide; N-type thin semiconductor layers 17, formed in the P-type epitaxial layer 2 and beside the sidewalls of the trenches 14, the N-type thin semiconductor layers 17 being formed by thermal diffusion of N-type impurity through the thermal oxide film 15 into the P-type epitaxial layer 2, wherein the N-type impurity comes from an N-type silicon 16 formed by polysilicon or amorphous silicon, the N-type silicon 16 being deposited on the thermal oxide film 15 in the trenches 14 and being completely oxidized to form oxide to fill the trenches 14 after the thermal diffusion.

In other embodiments, all the P in steps 1 to 14 can be replaced by N, and all the N in steps 1 to 14 can be replaced by P. Thus, a superjunction NMOSFET can be realized by the same processes as disclosed in the above embodiment.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A manufacturing method of a semiconductor device with alternately arranged P-type and N-type thin semiconductor layers, comprising the following steps:
   step1: depositing dielectric on a P-type epitaxial layer;
   step2: forming trenches in the dielectric and the P-type epitaxial layer by lithography and etching;
   step3: forming thermal oxide film on the surfaces of the trenches and the dielectric;
   step4: depositing N-type silicon on the thermal oxide film, wherein the N-type silicon is polysilicon or amorphous silicon;
   step5: diffusing the N-type impurity of the N-type silicon within the trenches through the thermal oxide film into the P-type epitaxial layer by thermal diffusion technique;
   step6: completely oxidizing the N-type silicon to fully fill the trenches with oxide;
   step7: removing the oxide and the dielectric on the P-type epitaxial layer.

2. The manufacturing method according to claim 1, wherein, in step 1, the dielectric is oxide.

3. The manufacturing method according to claim 1, wherein, in step 1, the dielectric is an oxide layer with a nitride layer formed thereon.

4. The manufacturing method according to claim 1, wherein, in step 2, photo resist or the dielectric is used as a block mask in the etching process to form the trenches.

5. The manufacturing method according to claim 1, wherein, the thermal oxide film and the dielectric on the P-type epitaxial layer after step 3 are thick enough to block the diffusion of the N-type impurity of the N-type silicon into the P-type epitaxial layer in step 5.

6. The manufacturing method according to claim 1, wherein, in step 4, the thickness of the N-type silicon in the trenches is less than 0.25 times of the width of the trench.

7. A semiconductor device structure with alternately arranged P-type and N-type thin semiconductor layers, comprising:
- a P-type epitaxial layer;
- trenches formed in the P-type epitaxial layer, wherein, each trench has a thermal oxide film formed on its surface, and the trenches are fully filled with oxide;
- N-type thin semiconductor layers, formed in the P-type epitaxial layer and beside the sidewalls of the trenches, the N-type thin semiconductor layers being formed by thermal diffusion of N-type impurity through the thermal oxide film into the P-type epitaxial layer, wherein the N-type impurity comes from an N-type silicon formed by polysilicon or amorphous silicon, the N-type silicon being deposited on the thermal oxide film in the trenches and being completely oxidized to form oxide to fill the trenches after the thermal diffusion.

8. A manufacturing method of a semiconductor device structure with alternately arranged P-type and N-type thin semiconductor layers, comprising the following steps:
- step1: depositing dielectric on an N-type epitaxial layer;
- step2: forming trenches in the dielectric and the N-type epitaxial layer by lithography and etching;
- step3: forming thermal oxide film on the surfaces of the trenches and the dielectric;
- step4: depositing P-type silicon on the thermal oxide film, wherein the P-type silicon is polysilicon or amorphous silicon;
- step5: diffusing the P-type impurity of the P-type silicon within the trenches through the thermal oxide film into the N-type epitaxial layer by thermal diffusion technique;
- step6: completely oxidizing the P-type silicon to fully fill the trenches with oxide;
- step7: removing the oxide and the dielectric on the N-type epitaxial layer.

9. The manufacturing method according to claim 8, wherein, in step 1, the dielectric is oxide.

10. The manufacturing method according to claim 8, wherein, in step 1, the dielectric is an oxide layer with a nitride layer formed thereon.

11. The manufacturing method according to claim 8, wherein, in step 2, photo resist or the dielectric is used as a block mask in the etching process to form the trenches.

12. The manufacturing method according to claim 8, wherein, the thermal oxide film and the dielectric on the N-type epitaxial layer after step 3 are thick enough to block the diffusion of the P-type impurity of the P-type silicon into the N-type epitaxial layer in step 5.

13. The manufacturing method according to claim 8, wherein, in step 4, the thickness of the P-type silicon in the trench is less than 0.25 times of the width of the trench.

14. A semiconductor device structure with alternately arranged P-type and N-type thin semiconductor layers, comprising:
- an N-type epitaxial layer;
- trenches formed in the N-type epitaxial layer, wherein, each trench has a thermal oxide film formed on its surface, and the trenches are fully filled with oxide;
- P-type thin semiconductor layers, formed in the N-type epitaxial layer and beside the sidewalls of the trenches, the P-type thin semiconductor layers being formed by thermal diffusion of P-type impurity through the thermal oxide film into the N-type epitaxial layer, wherein, the P-type impurity comes from P-type silicon formed by polysilicon or amorphous silicon, the P-type silicon being deposited on the thermal oxide film in the trenches and being completely oxidized to form oxide to fill the trenches after the thermal diffusion.

* * * * *